(12) United States Patent
Greenlee et al.

(10) Patent No.: US 11,996,151 B2
(45) Date of Patent: May 28, 2024

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); John D. Hopkins, Meridian, ID (US); Andrew Li, Boise, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 387 days.

(21) Appl. No.: 17/315,727

(22) Filed: May 10, 2021

(65) Prior Publication Data

US 2022/0359012 A1    Nov. 10, 2022

(51) Int. Cl.
*H10B 41/27* (2023.01)
*G11C 16/04* (2006.01)
(Continued)

(52) U.S. Cl.
CPC ........ *G11C 16/0483* (2013.01); *H01L 29/161* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC .... G11C 16/0483; H10B 41/10; H10B 43/35; H10B 41/35; H10B 43/10; H10B 41/27; H10B 43/27; H01L 29/161
See application file for complete search history.

(56) References Cited

U.S. PATENT DOCUMENTS 10,199,359 B1 *   2/2019   Sakakibara ....... H01L 29/66833
2012/0181603 A1   7/2012   Ahn
(Continued)

FOREIGN PATENT DOCUMENTS

TW    202101683    1/2021
TW    202111929    3/2021
(Continued)

*Primary Examiner* — Ali Naraghi
*Assistant Examiner* — Siangluai Mang
(74) *Attorney, Agent, or Firm* — Wells St. John P.S.

(57) ABSTRACT

A memory array comprising laterally-spaced memory blocks individually comprises a vertical stack comprising alternating insulative tiers and conductive tiers. Channel-material strings of memory cells extend through the insulative tiers and the conductive tiers. The laterally-spaced memory blocks in a lower one of the conductive tiers comprises elemental-form metal that extends longitudinally-along the laterally-spaced memory blocks proximate laterally-outer sides of the laterally-spaced memory blocks. A metal silicide or a metal-germanium compound is directly against laterally-inner sides of the elemental-form metal in the lower conductive tier and that extends longitudinally-along the laterally-spaced memory blocks in the lower conductive tier. The metal of the metal silicide or of the metal-germanium compound is the same as that of the elemental-form metal. Other embodiments, including method, are disclosed.

22 Claims, 17 Drawing Sheets

(51) Int. Cl.
*H01L 29/161* (2006.01)
*H10B 41/10* (2023.01)
*H10B 41/35* (2023.01)
*H10B 43/10* (2023.01)
*H10B 43/27* (2023.01)
*H10B 43/35* (2023.01)

(56) References Cited

U.S. PATENT DOCUMENTS

| | | | |
|---|---|---|---|
| 2014/0239303 A1* | 8/2014 | Zhu | H01L 23/5226 257/66 |
| 2017/0148800 A1 | 5/2017 | Nishikawa et al. | |
| 2017/0148810 A1 | 5/2017 | Kai et al. | |
| 2017/0148811 A1 | 5/2017 | Zhang et al. | |
| 2018/0122906 A1* | 5/2018 | Yu | H10B 41/27 |
| 2018/0323213 A1* | 11/2018 | Arai | H10B 43/50 |
| 2018/0366486 A1* | 12/2018 | Hada | H10B 41/27 |
| 2018/0374866 A1* | 12/2018 | Makala | H10B 43/10 |
| 2019/0115362 A1 | 4/2019 | Chi | |
| 2019/0157294 A1* | 5/2019 | Kanamori | H10B 43/27 |
| 2019/0214344 A1* | 7/2019 | Yu | H01L 23/535 |
| 2020/0127004 A1* | 4/2020 | Dorhout | H10B 43/27 |
| 2020/0144283 A1* | 5/2020 | Kim | H10B 43/27 |
| 2020/0266203 A1 | 8/2020 | Bhushan et al. | |
| 2020/0373310 A1 | 11/2020 | Koshizawa et al. | |
| 2020/0373316 A1 | 11/2020 | Luo et al. | |

FOREIGN PATENT DOCUMENTS

| | | |
|---|---|---|
| WO | WO 2017/087670 | 5/2017 |
| WO | PCT/US2022/023119 | 7/2022 |
| WO | WO PCT/US2022/023119 | 11/2023 |

* cited by examiner

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-27 which may be considered as a "gate-last" or "replacement-gate" process.

Figure 1:
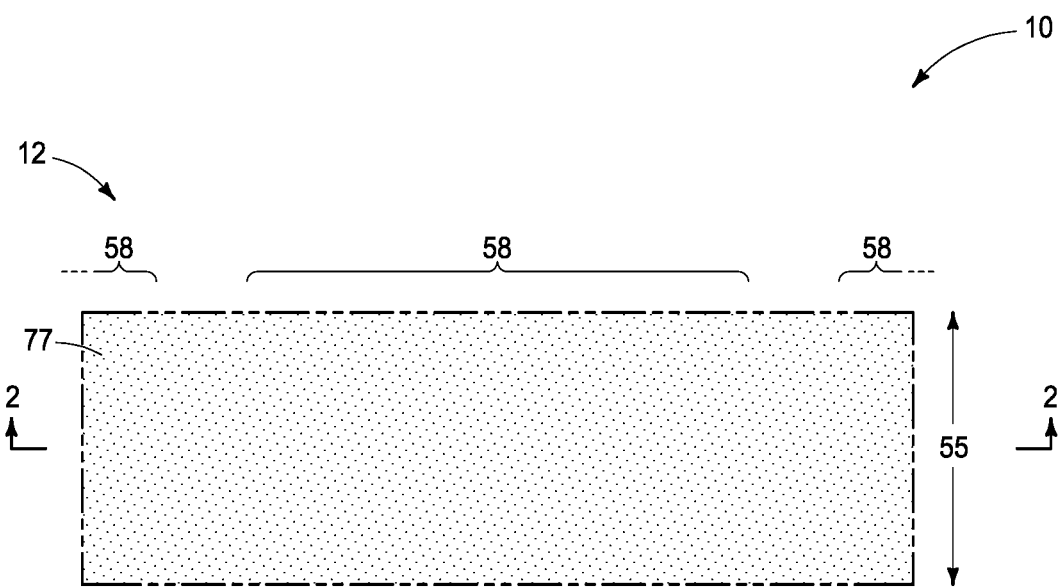
FIGS. 1 and 2 are diagrammatic cross-sectional views of portions of what will be an array of elevationally-extending strings of memory cells in accordance with an embodiment of the invention.
Figure 2:
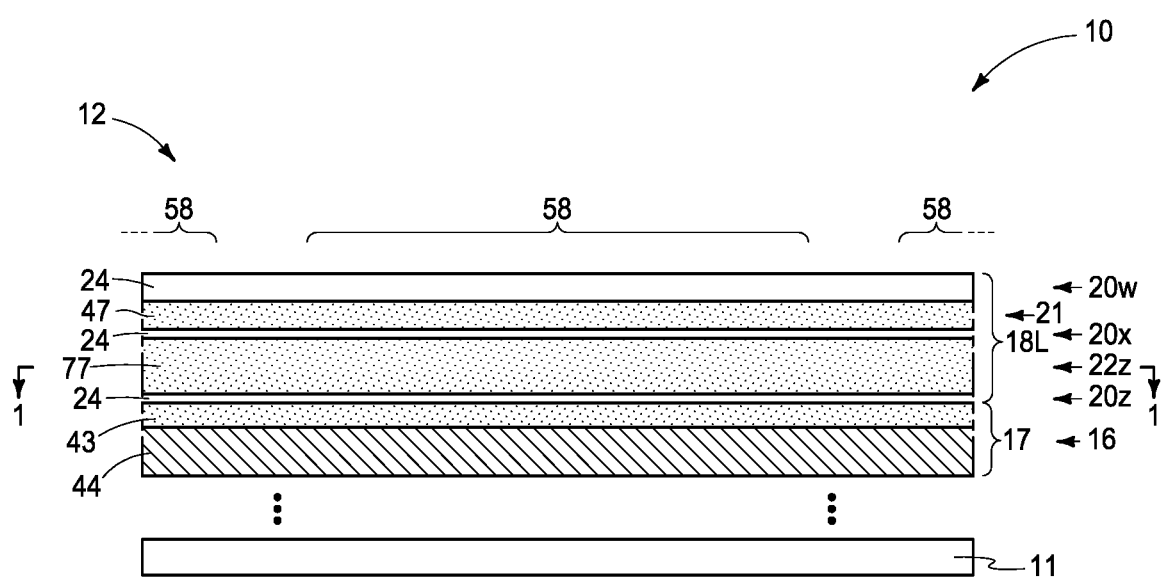

FIGS. 1 and 2 show a construction 10 having an array region 12 in which elevationally-extending strings of transistors and/or memory cells will be formed. Construction 10 comprises a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array (e.g., array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tier(s) 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z when present is insulative (e.g., comprising a material 24 comprising silicon dioxide) and may be sacrificial. A lowest 22z of first tiers 22* is directly above (e.g., directly against) lowest second tier 20z. Lowest first tier 22z comprises sacrificial material 77 (e.g., silicon nitride or polysilicon). In one embodiment, a next-lowest tier 20x of second tiers 20* is directly above lowest first tier 22z (e.g., comprising material 24). Lower portion 18L comprises an uppermost tier, for example a next-next lowest second tier 20w in one embodiment (e.g., comprising material 24) and hereafter referred to as 20w regardless of composition and regardless of whether such remains in the finished circuitry construction. An intermediate tier 21 is vertically between lowest first tier 22z and uppermost tier 20w. Tiers 20w and 21 may be of the same or of different thickness(es) relative one another. Intermediate tier 21 comprises material 47 that comprises at least one of silicon and germanium (e.g., in elemental form or an alloy of both or a non-alloy mixture of both). Additional tiers may be present. For example, one or more additional tiers may be above tier 20w (tier 20w thereby not being the uppermost tier in lower portion 18L, and not shown), between tier 20w and intermediate tier 21 (not shown), and/or below tier 22z (other than 20z not being shown). In one embodiment, lower portion 18L comprises an intervening tier (e.g., 20x) of different composition from that of intermediate tier 21 vertically between intermediate tier 21 and lowest first tier 22z. In one embodiment, material 47 of intermediate tier 21 comprises silicon in elemental form and in one embodiment comprises germanium in elemental form. In one embodiment, material 47 of intermediate tier 21 comprises silicon and germanium. In one embodiment, the intermediate tier is of different composition from that of the uppermost tier.

Figure 3:
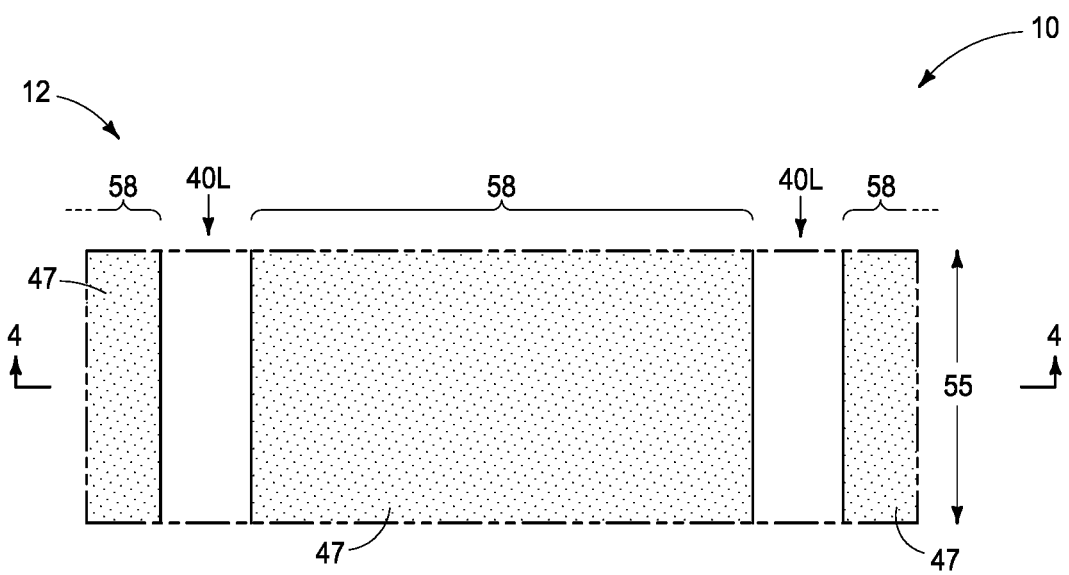
FIGS. 3-29 are diagrammatic sequential sectional and/or enlarged views of the construction of FIGS. 1 and 2, or portions thereof or alternate and/or additional embodiments, in process in accordance with some embodiments of the invention.
Figure 4:
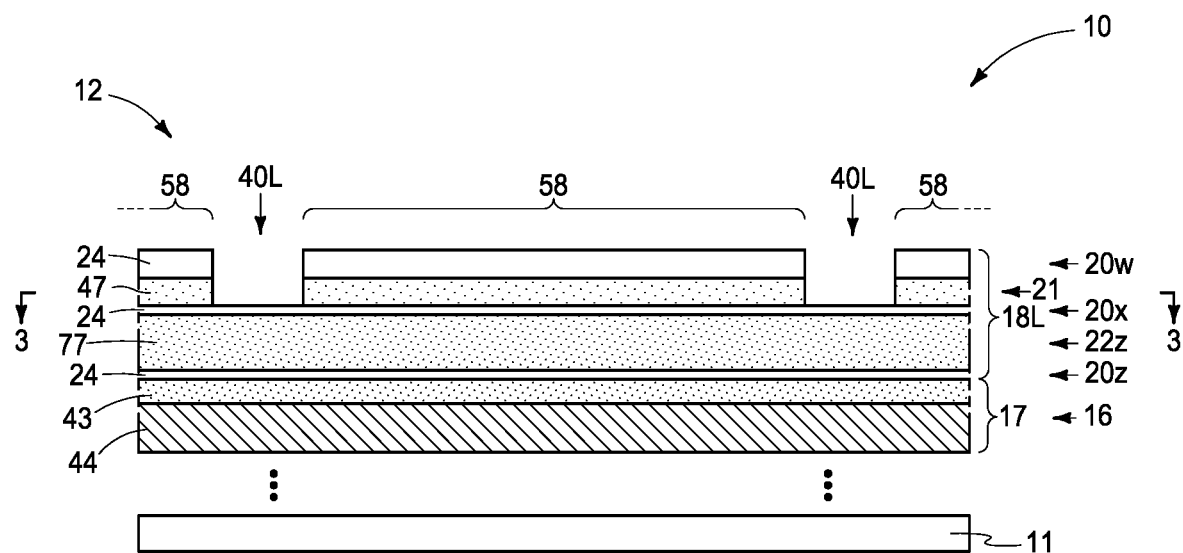

Referring to FIGS. 3 and 4, lower horizontally-elongated trenches 40L have been formed through uppermost tier 20w and into intermediate tier 21 in lower portion 18L (e.g., by photolithographic patterning and etch). Lower horizontally-elongated trenches 40L are individually between immediately-laterally-adjacent memory-block regions 58 (i.e., at least partially there-between). In one embodiment and as shown, lower horizontally-elongated trenches 40L as initially formed extend through intermediate tier 21 but not to lowest first tier 22z. In one such embodiment, the forming of lower horizontally-elongated trenches 40L comprises etching and, as shown, such etching has stopped on intervening tier 20x (i.e., atop or within).

Figure 5:
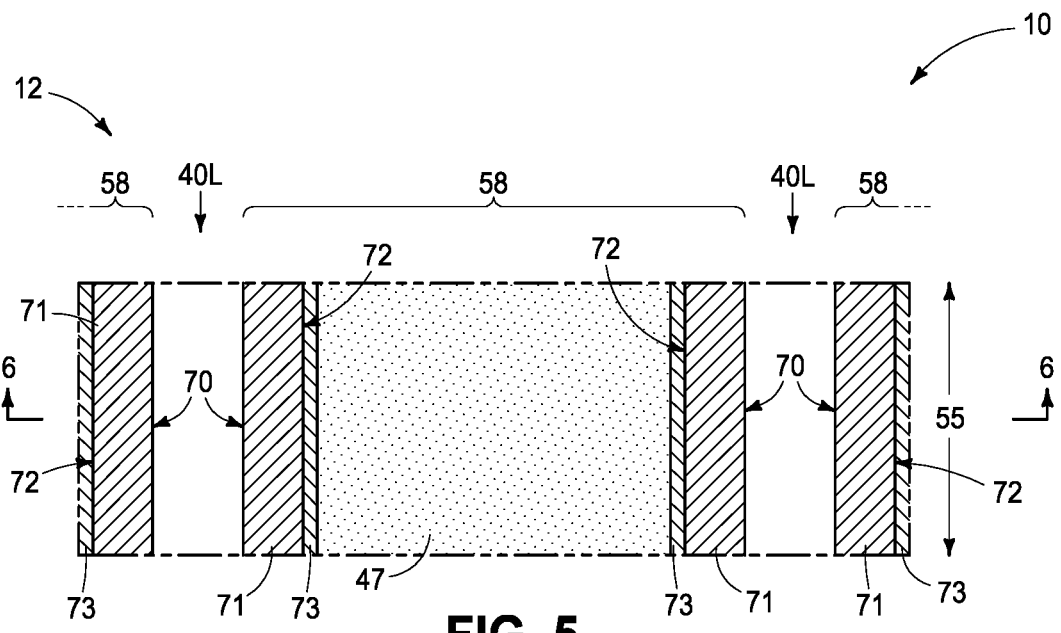
Figure 6:
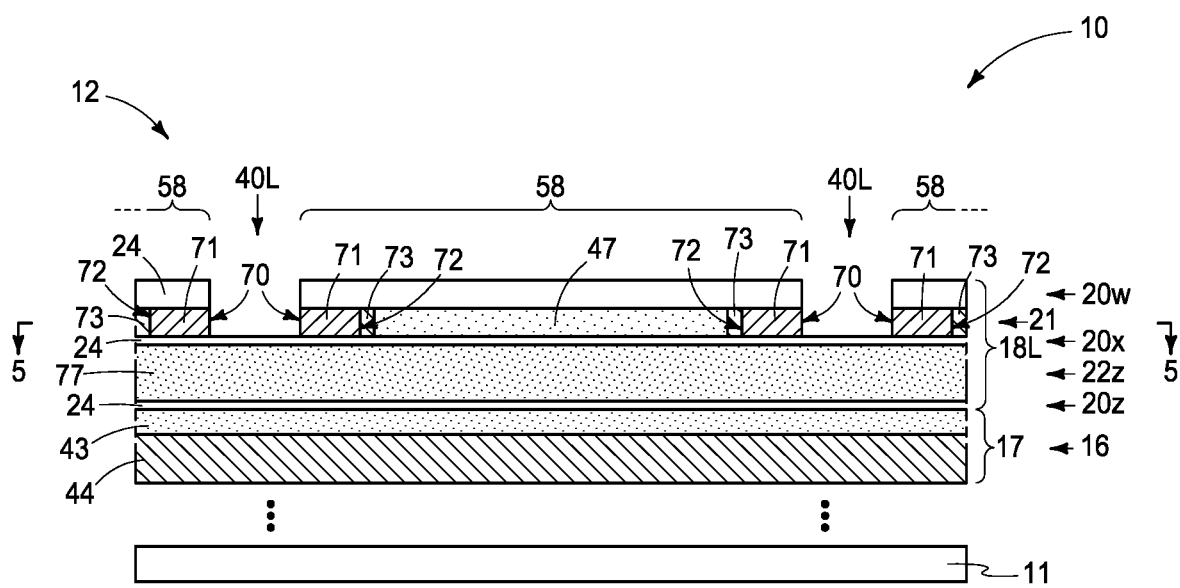

Referring to FIGS. 5 and 6, a metal halide has been reacted with the at least one of the silicon and germanium of material 47 to form sidewalls 70 of lower horizontally-elongated trenches 40L in intermediate tier 21 of a material 71 that comprises metal of the metal halide and that extends longitudinally-along laterally-spaced memory-block regions 58 in intermediate tier 21. In one embodiment, sidewalls 70 and material 71 are in elemental form. In one embodiment and as shown, a metal silicide 73 (comprising the metal of the metal halide) or a metal-germanium compound 73 (comprising the metal of the metal halide) has also been formed and which is directly against laterally-inner sides 72 of the elemental-form metal of material 71 and that extends longitudinally-along laterally-spaced memory blocks 58 in intermediate tier 21. In one embodiment, material 73 comprises the metal silicide, in one embodiment comprises the metal-germanium compound, and in one embodiment comprises both of the metal silicide and the metal-germanium compound. In one embodiment and as shown, the reacting forms the metal of the metal halide in the intermediate tier within the immediately-laterally-adjacent memory block regions.

Any metal halide may be used. By way of examples and not of limitation, examples are $WF_6$, $WF_5$, $MoCl_6$, and $NbF_5$. Regardless, an example temperature range for the reacting includes 200° C. to 700° C., an example pressure range of 1 mTorr to 1 atmosphere, and an example time period of 0.1 second to 100 seconds. The metal halide may be provided as a gas (with or without forming any plasma therefrom), and may be diluted with an inert gas (e.g., a noble gas or $N_2$). Accordingly, and, regardless, with such examples, the elemental-metal formed in ideal embodiments would be any of W, Mo, or Nb. With such examples, the silicide when formed would be any of $WSi_x$, $MoSi_x$, or $NbSi_x$ (which may or may not be stoichiometric), and the metal germanium compound when formed would be any of $WGe_x$, $MoGe_x$, or $NbGe_x$ (which may or may not be stoichiometric).

Figure 7:
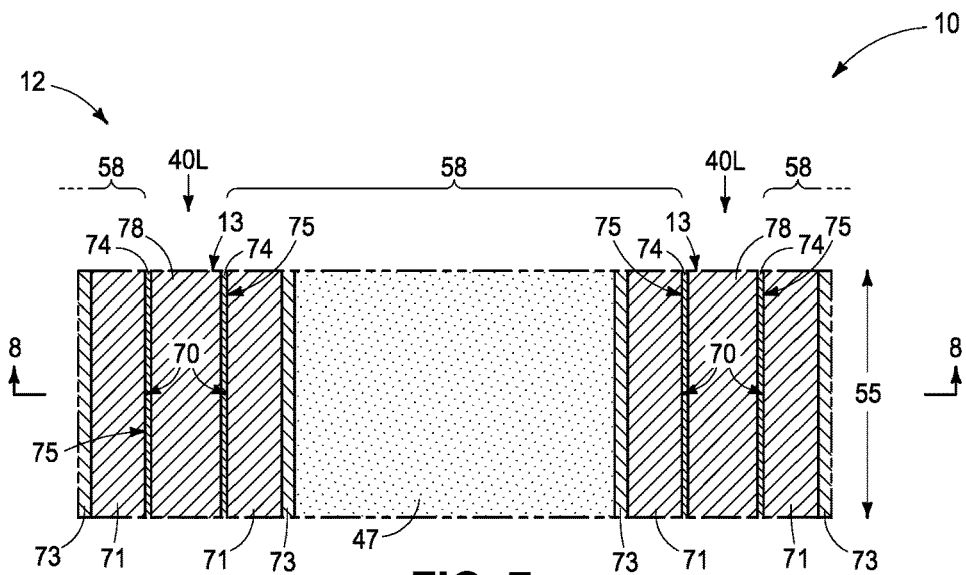
Figure 8:
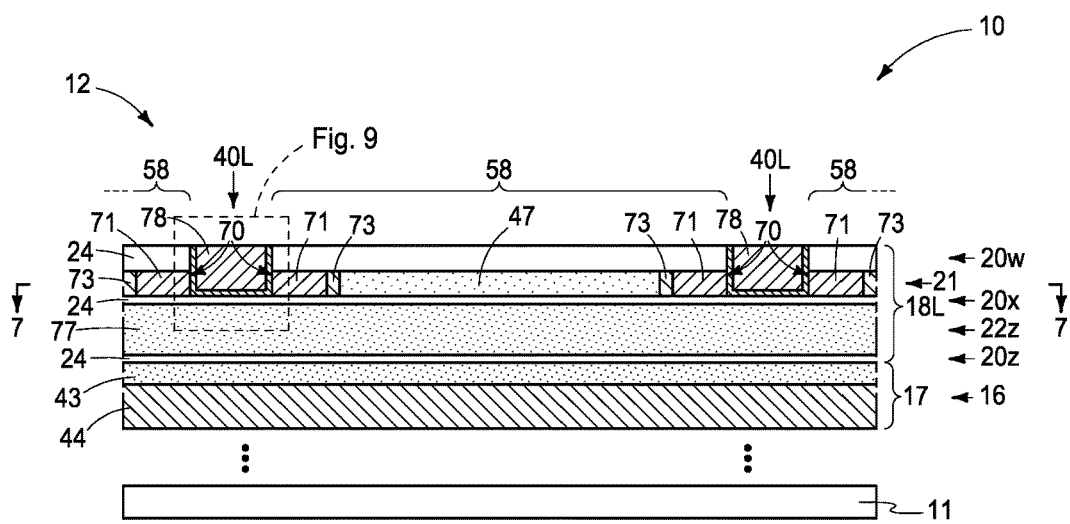
Figure 9:
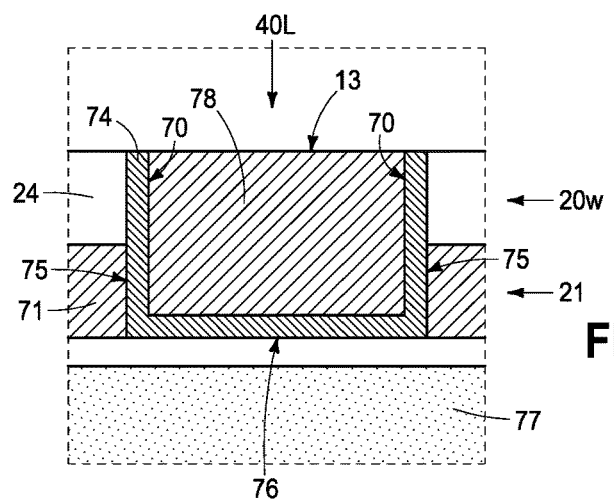
Figure 10:
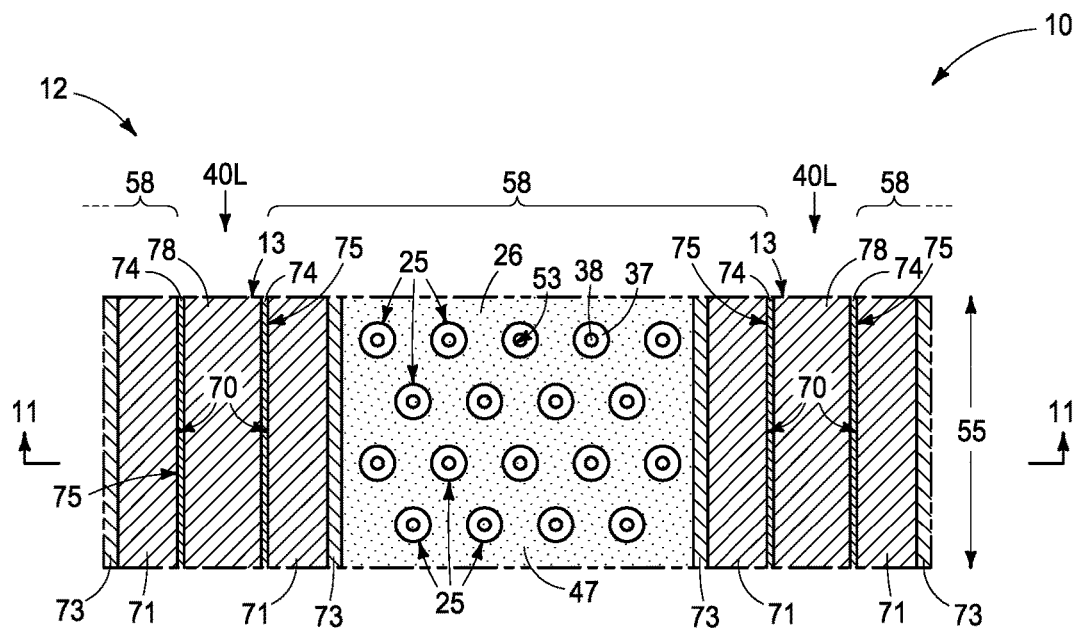
Figure 11:
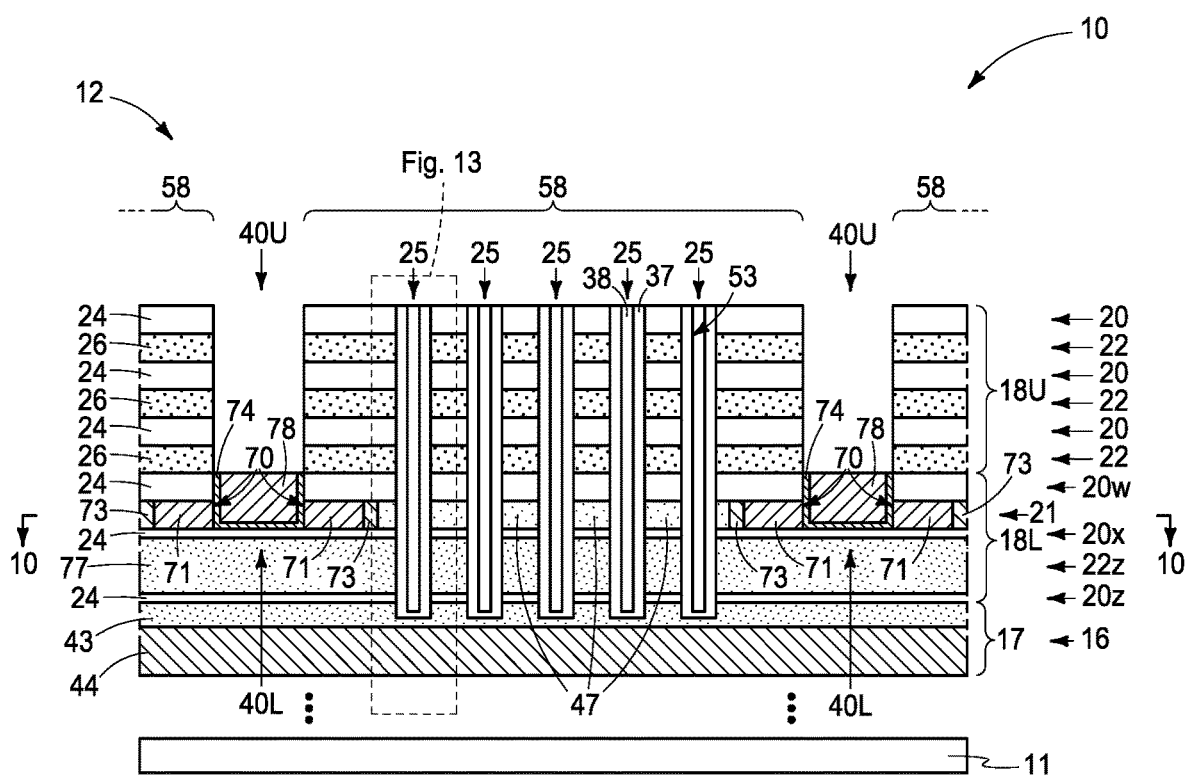
Figure 12:
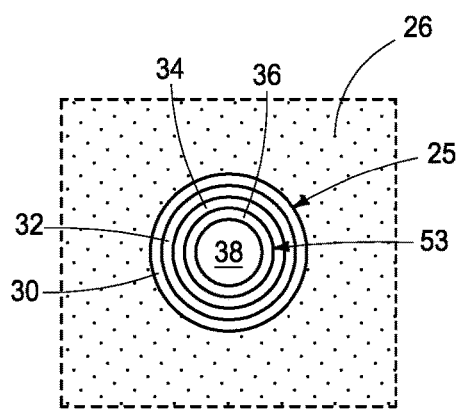
Figure 13:
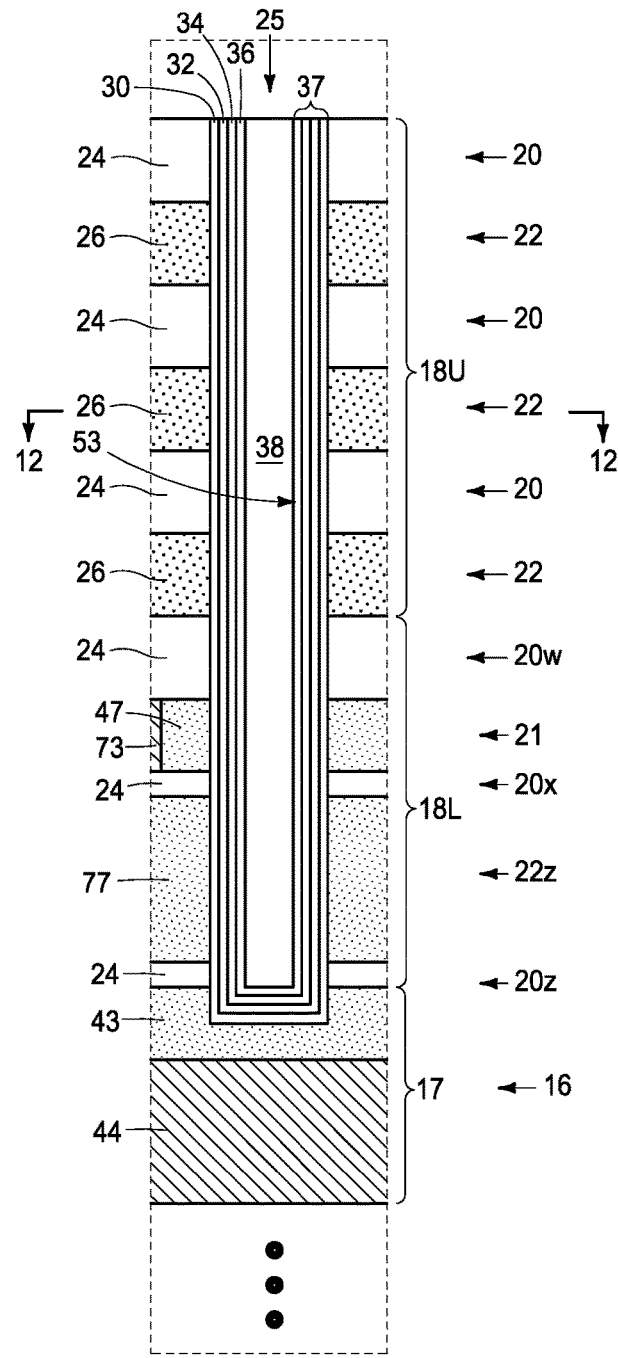

Referring to FIGS. 7-9, and in one embodiment, after the reacting, sacrificial lines 13 have been formed in lower horizontally-elongated trenches 40L. In one such embodiment, sacrificial lines 13 comprise the elemental-form metal of the metal halide. In one such example and as shown, individual sacrificial lines 13 comprise an exterior lining 74 as line sidewalls 75 and as a line base 76, with exterior lining 74 being of different composition from the elemental-form metal (e.g., being a metal compound, for example TiN), with the elemental-form metal 78 being laterally-between and directly above line sidewalls 75 and line base 76, respectively.

Referring to FIGS. 10-13, an upper portion 18U of stack 18* has been formed above lower portion 18L. Upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a first tier 22 although such could alternately start with a second tier 20 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20 and first tiers 22 in upper portion 18U to conductor tier 16 in lower portion 18L (e.g., at least to lowest first tier 22z). Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 10-13 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in FIGS. 10 and 11 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Upper horizontally-elongated trenches 40U have been formed (e.g., by anisotropic etching) in upper portion 18U. Upper trenches 40U are individually directly above and extend longitudinally-along individual lower horizontally-elongated trenches 40L. When sacrificial lines 13 are present, upper trenches 40U are individually directly above, extend longitudinally-along, and extend to individual sacrificial lines 13 in lower portion 18L. Trenches 40 may taper laterally-inward in vertical cross-section moving deeper into stack 18*. By way of example and for brevity only, channel openings 25 are shown as being arranged in groups or columns of staggered rows of four and five channel openings 25 per row. Trenches 40* will typically be wider than channel openings 25 (e.g., 10 to 20 times wider, yet such wider degree not being shown for brevity). Any alternate existing or future-developed arrangement and construction may be used. Trenches 40U and channel openings 25 may be formed in any order relative the other or at the same time.

The reacting of a metal halide with the at least one of the silicon and germanium of material 47 of FIGS. 7-9 to form material 71 (and 73 when present) may extend to locations where channel openings 25 will be formed (not shown) or may extend to be everywhere laterally-spaced therefrom (as shown). Regardless, provision of material 71 that comprises the metal of the metal halide in memory block regions 58 may provide added lateral misalignment protection for the typical photolithographic mask that is used to form upper trenches 40U between memory block regions 58 (regardless of presence of sacrificial lines 13), with ideal perfect alignment between regions 58 being shown for brevity.

Figure 14:
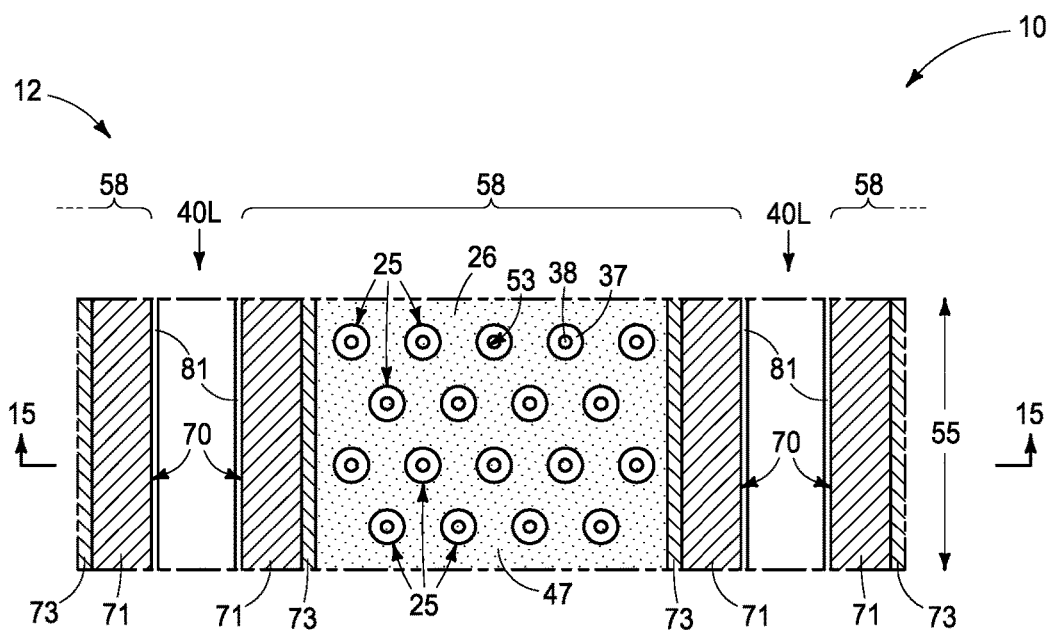
Figure 15:
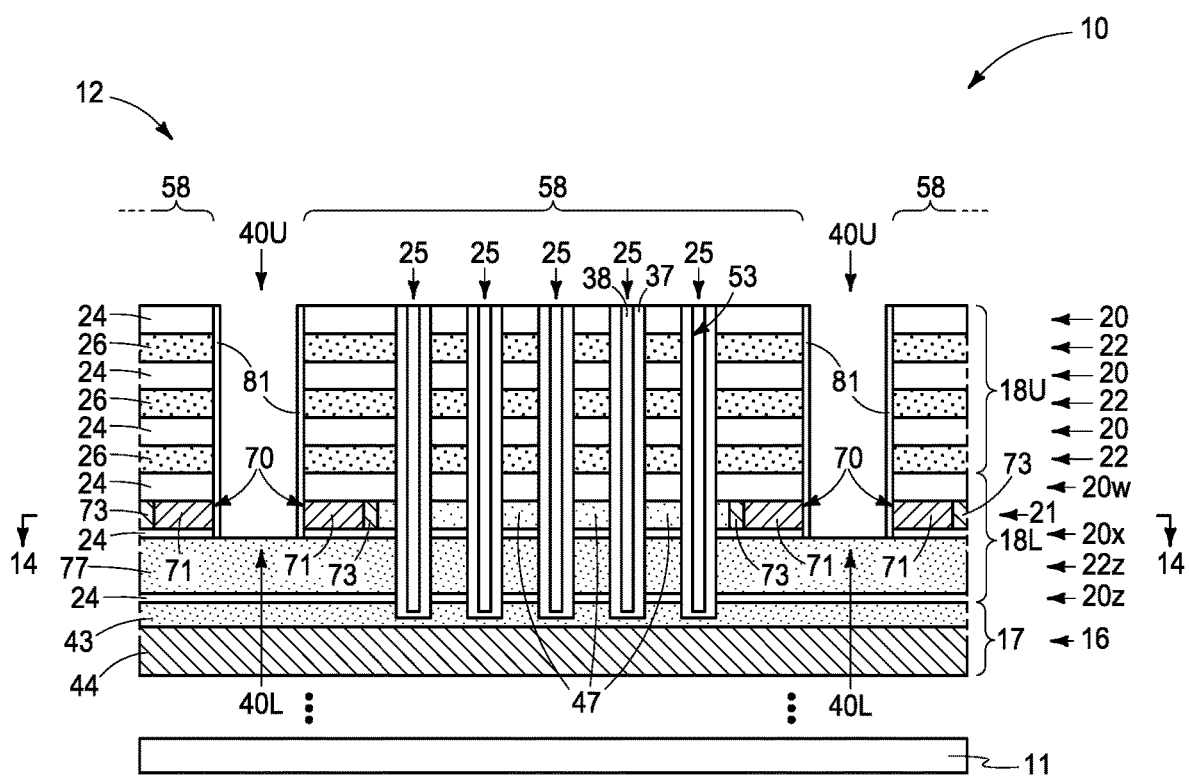

Referring to FIGS. 14 and 15, elemental-form metal 78 (not shown) of sacrificial lines 13 (not shown) that is in lower portion 18L has been removed through upper trenches 40U (e.g., by isotropic etching using a mixture of ammonia and hydrogen peroxide or a mixture of sulfuric acid and hydrogen peroxide if material 15 comprises W). Some or all of exterior lining 74 (not shown) may also be removed (as shown) when present or some or all of exterior lining 74 may remain (not shown). FIGS. 14 and 15 also show trenches 40* as having been optionally lined with a thin sacrificial liner 81 (e.g., hafnium oxide, aluminum oxide, silicon dioxide, silicon nitride, etc.) after removing elemental-form metal 78 (not shown) and/or lining 74 (not shown). Such has been followed by punch-etching there-through to expose material 24 of next-lowest second tier 20x, and followed by punch-etching through material 24 to expose material 77. When used, liner 81 may be formed before or after removing elemental-form metal 78 and/or lining 74.

Ultimately, through upper and lower horizontally-elongated trenches 40U and 40L, sacrificial material 77 in lowest first tier 22z is replaced with conductive material that directly electrically couples together channel material 36 of channel-material strings 53 and conductor material 17 of conductor tier 16. A first example method of doing so is described with reference to FIGS. 16-22.

Figure 16:
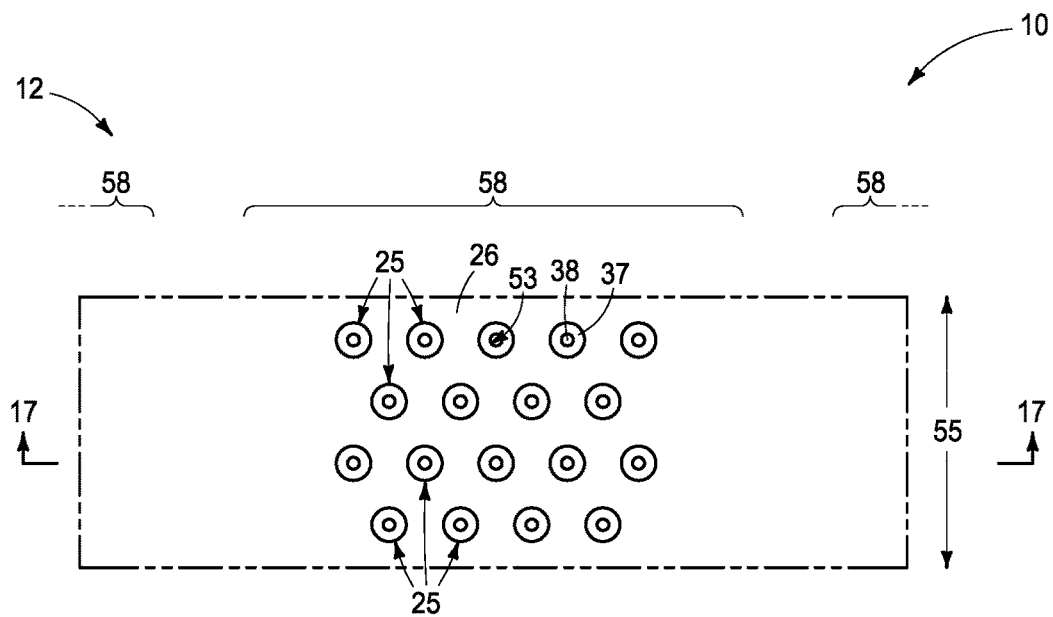
Figure 17:
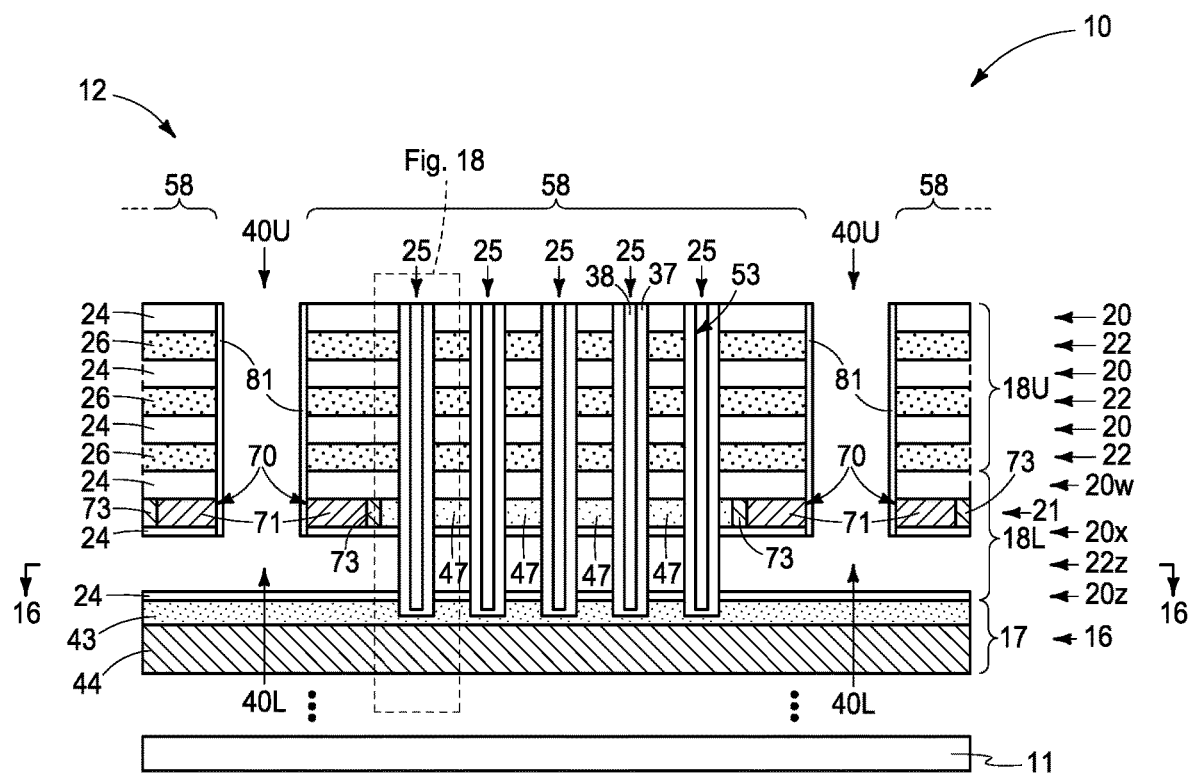
Figure 18:
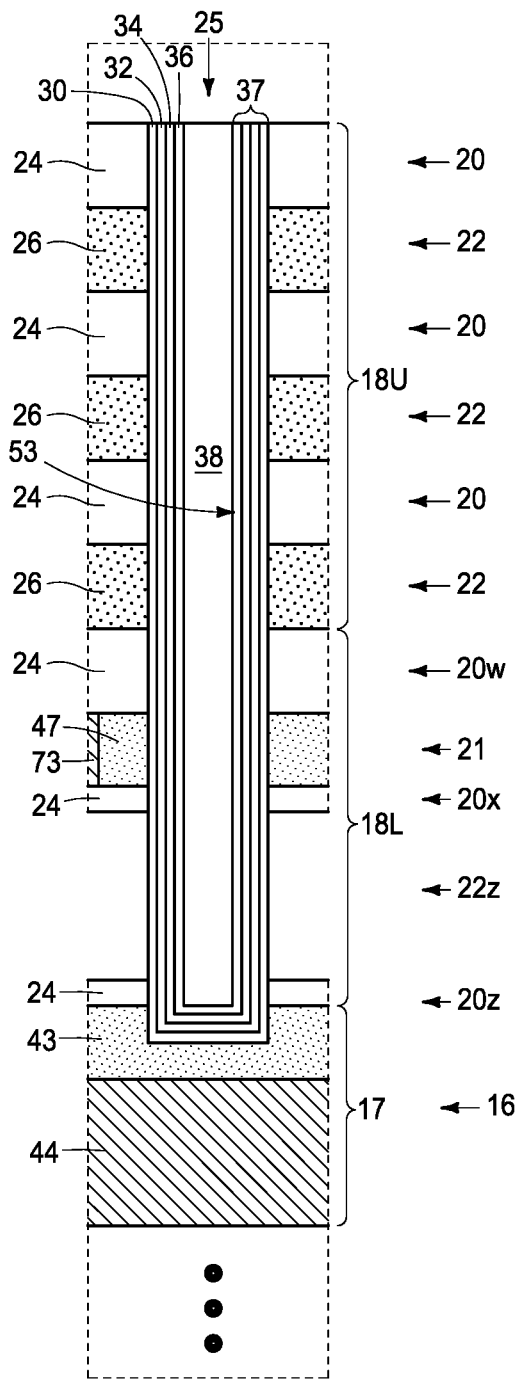

Referring to FIGS. 16-18, material 77 (not shown) has been removed from lowest first tier 22z through trenches 40, for example by isotropic etching (e.g., using liquid or vapor $H_3PO_4$ as a primary etchant where material 77 is silicon nitride or using tetramethyl ammonium hydroxide [TMAH] where material 77 is polysilicon).

Figure 19:
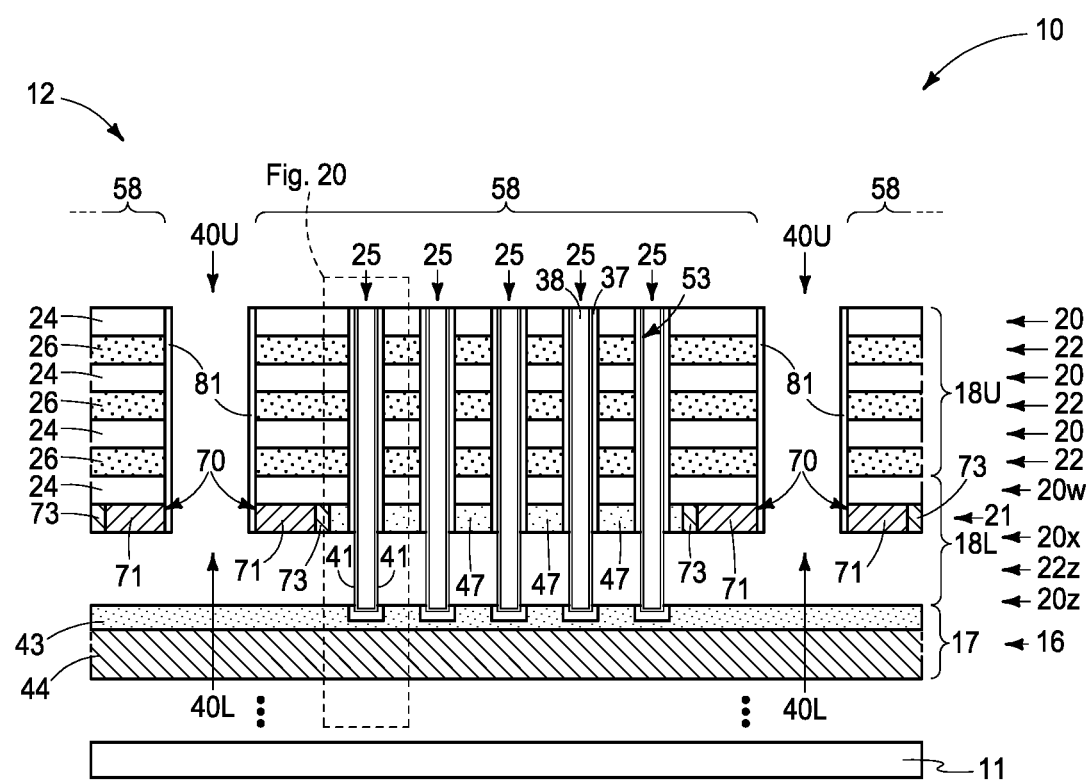
Figure 20:
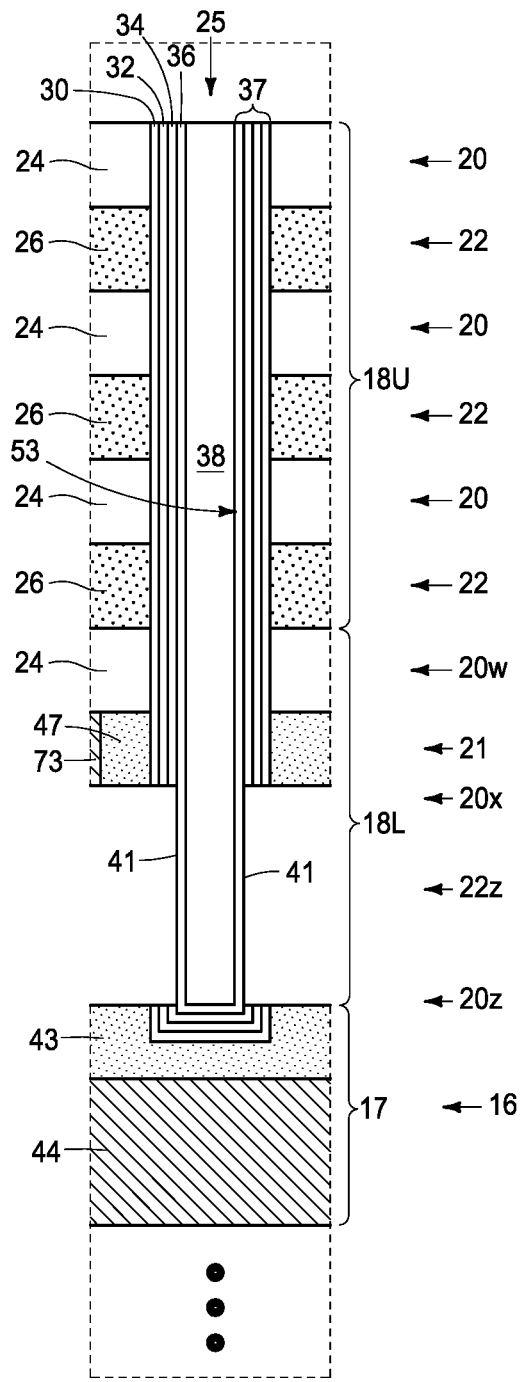

FIGS. 19 and 20 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. The artisan is capable of selecting other chemistries for etching other different materials where a construction as shown is desired. Some or all of insulative material (e.g., 24, and not shown) from tiers 20x and 20z (when present, and not shown as having been removed) may be removed when removing other materials, may be removed separately, or may partially or wholly remain (not shown).

Figure 21:
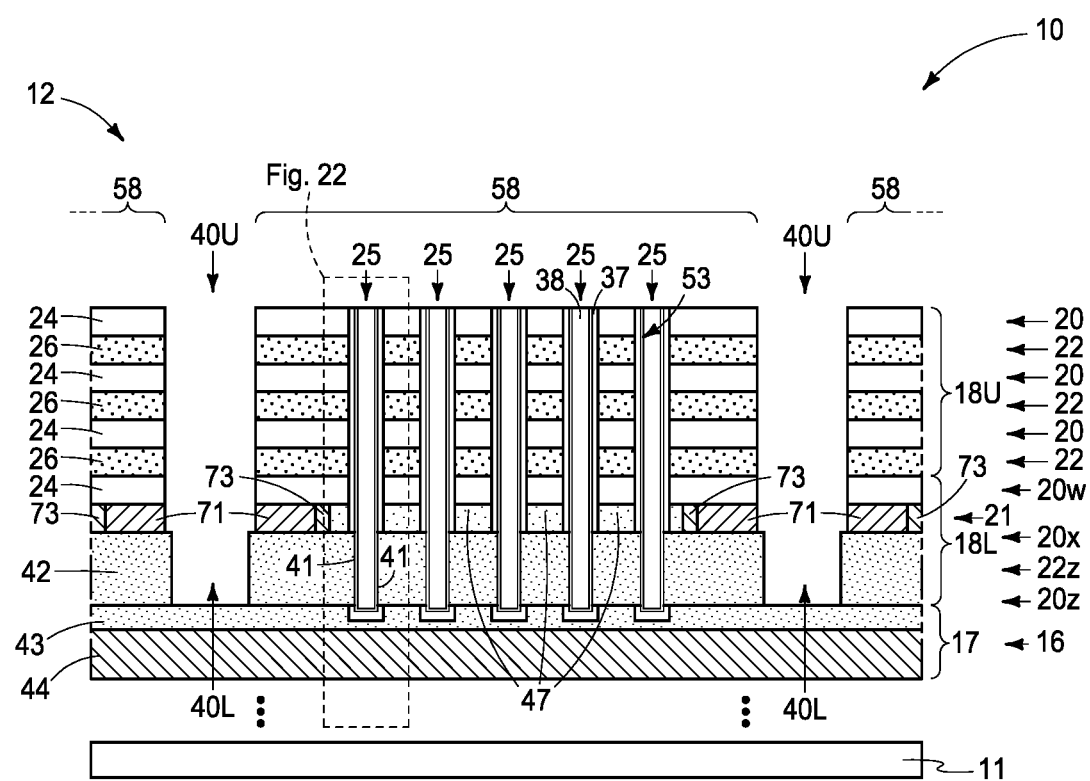
Figure 22:
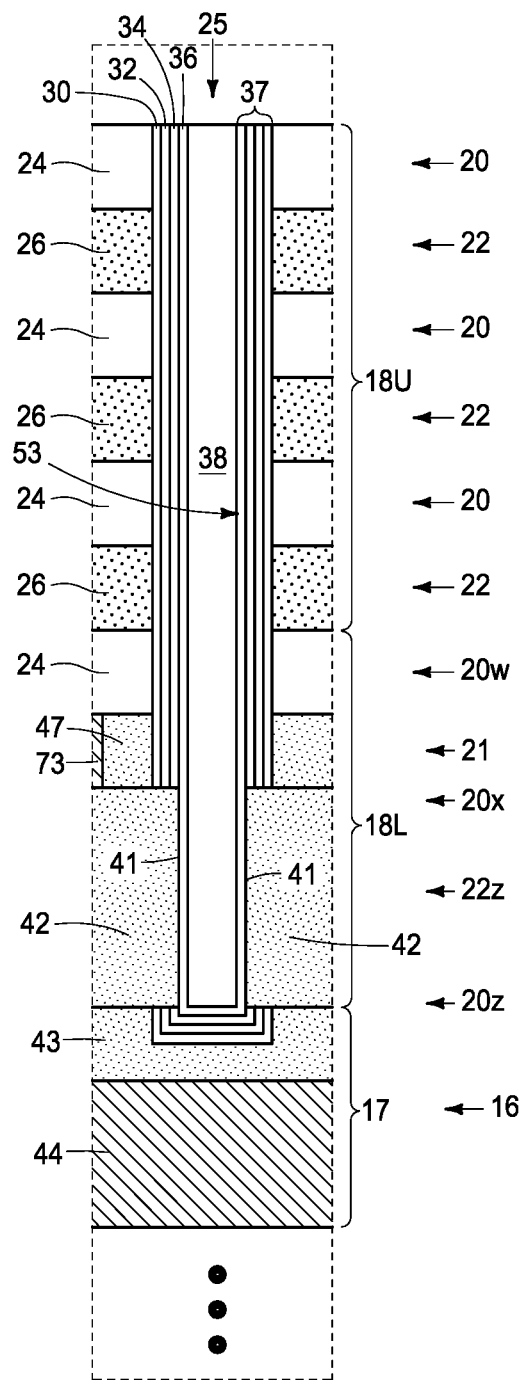
Figure 23:
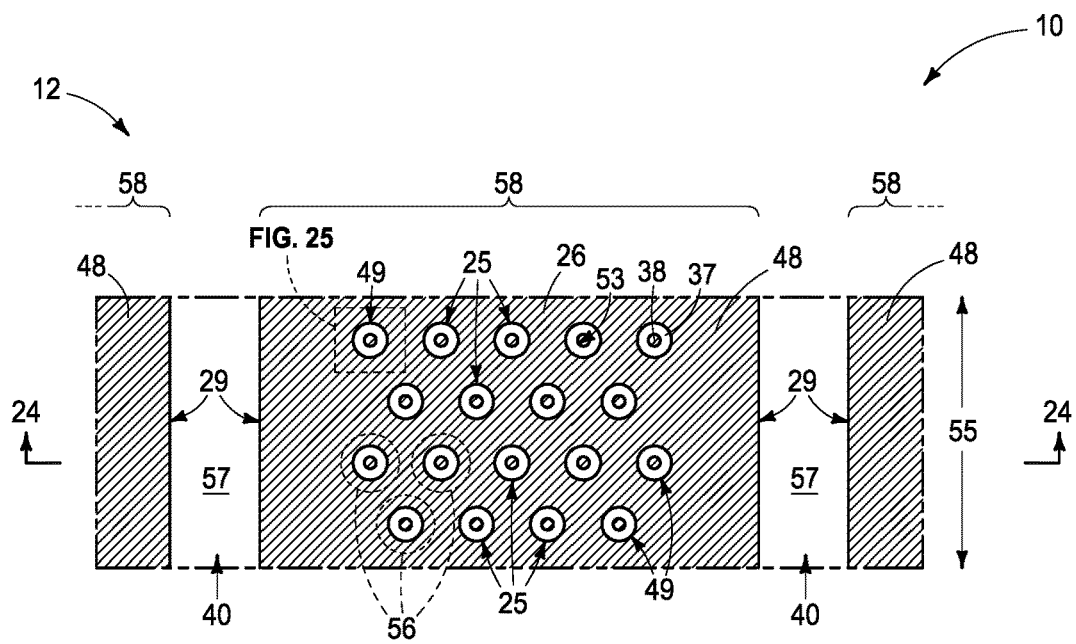
Figure 24:
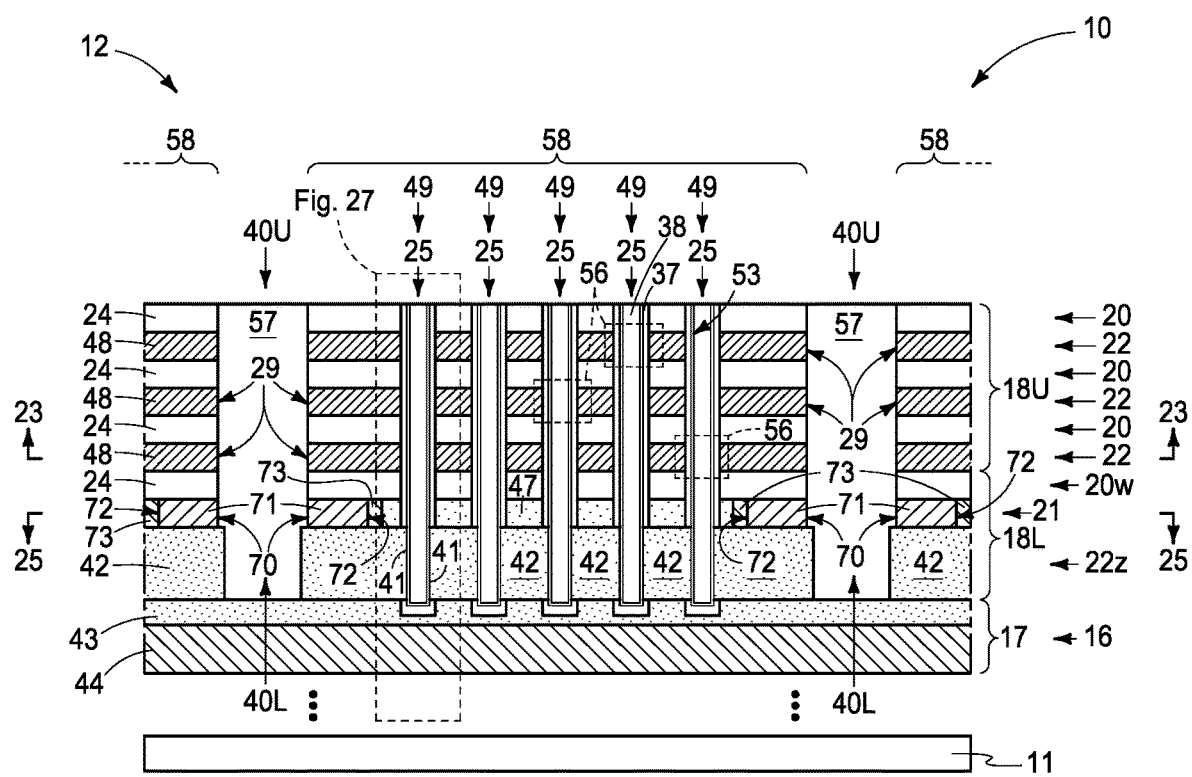
Figure 25:
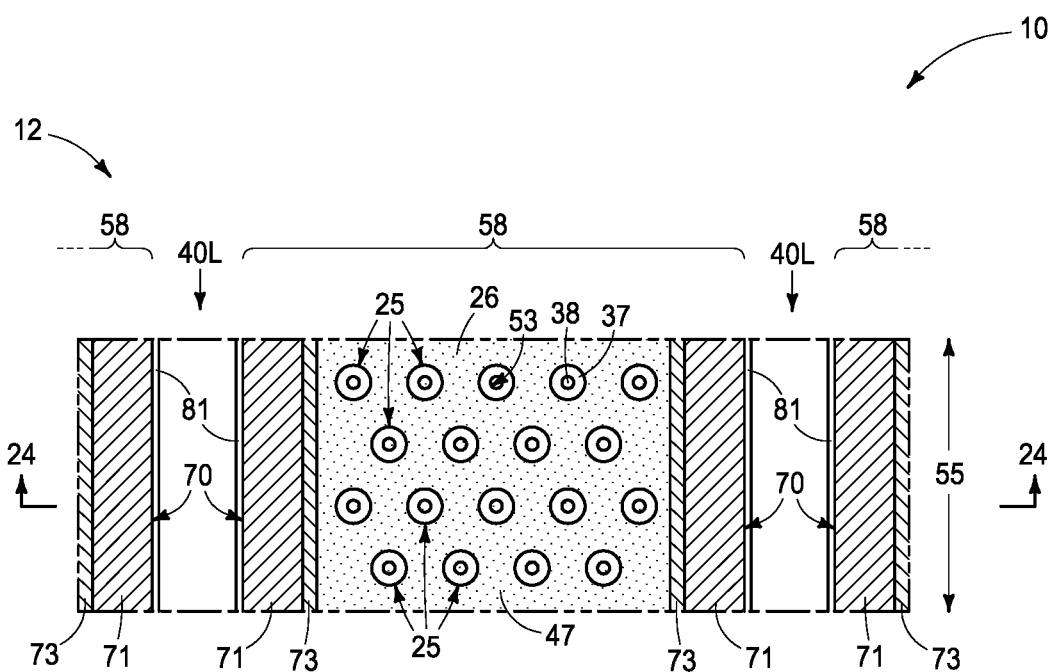
Figure 26:
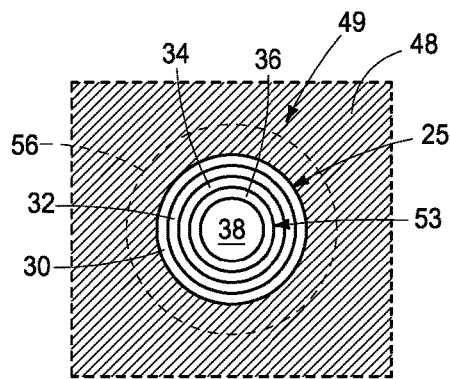
Figure 27:
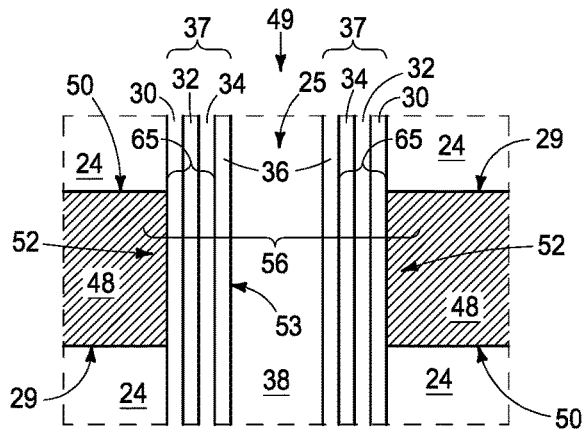
Figure 28:
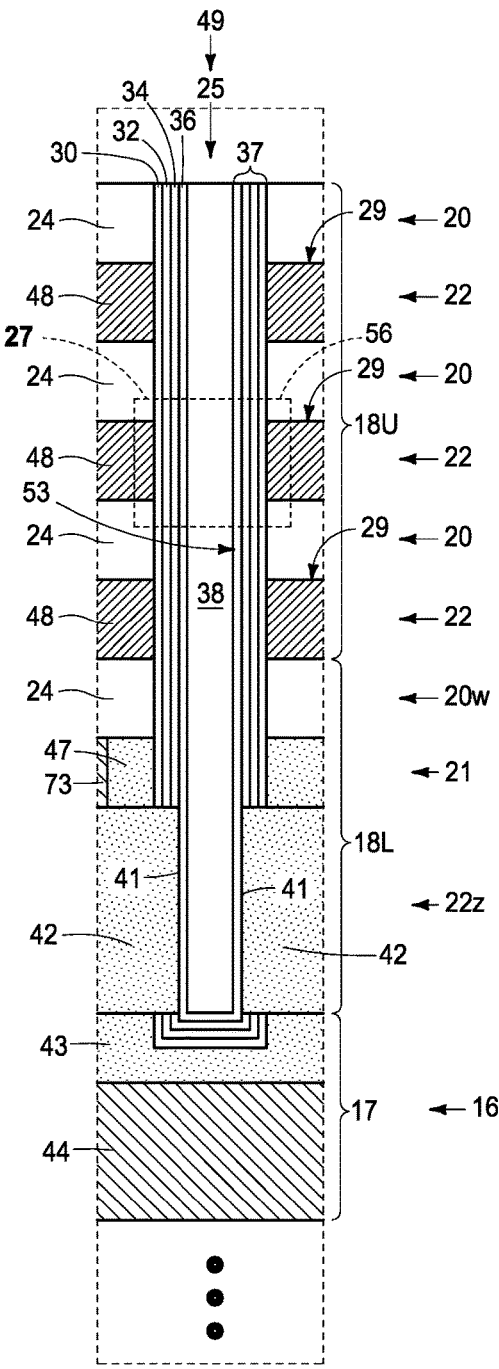

Referring to FIGS. 21 and 22, conductive material 42 (e.g., conductively-doped polysilicon) has been formed in lowest first tier 22z and in one embodiment directly against sidewall 41 of channel material 36. In one embodiment and as shown, such has been formed directly against a bottom of material 47 of conducting tier 21 and directly against a top of conductor material 43 of conductor tier 16, thereby directly electrically coupling together channel material 36 of individual channel-material strings 53 with conductor material 43 of conductor tier 16 and material 47 of conducting tier 21. Subsequently, and by way of example, conductive material 42 has been removed from trenches 40 as has sacrificial liner 81 (not shown). Sacrificial liner 81 may be removed before forming conductive material 42 (not shown).

Referring to FIGS. 23-28, material 26 (not shown) of conductive tiers 22 has been removed, for example by being isotropically etched away ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40*, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally-between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of operative channel-material strings 53 is never directly against any of conductor material 17 of conductor tier 16.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1\times10^{12}$ atoms/cm$^3$ of atoms of conductivity-increasing impurity in said material. In this document, "doped" is a material having more than $1\times10^{12}$ atoms/cm$^3$ of atoms of conductivity-increasing impurity therein and "conductively-doped" is material having at least $1\times10^{18}$ atoms/cm$^3$ of atoms of conductivity-increasing impurity therein. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises laterally-spaced memory blocks (e.g., 58) individually comprising a vertical stack (e.g., 18*) comprising alternating insulative tiers (e.g., 20*) and conductive tiers (e.g., 21, 22*). Channel-material strings (e.g., 53) of memory cells (e.g., 56) extend through the insulative tiers and the conductive tiers. The laterally-spaced memory blocks in a lower one of the conductive tiers (e.g., 21) comprises elemental-form metal (e.g., 71) that extends longitudinally-along the laterally-spaced memory blocks proximate laterally-outer sides (e.g., 70) of the laterally-spaced memory blocks. A metal silicide (e.g., 73) or a metal-germanium compound (e.g., 73) is directly against laterally-inner sides (e.g., 72) of the elemental-form metal in the lower conductive tier and that extends longitudinally-along the laterally-spaced memory blocks in the lower conductive tier, with the metal of the metal silicide or of the metal-germanium compound being the same as that of the elemental-form metal. In one such embodiment and as shown, at least one of the laterally-outer sides of individual of the laterally-spaced memory blocks (both as shown) has its laterally-outer side being the elemental-form metal that extends longitudinally-along the laterally-spaced memory blocks. In one embodiment, channel-material strings 53 individually comprise a construction (e.g., 37) having material (e.g., 34, 32, 30) radially-outward of the channel material (e.g., 36) of the channel-material strings and that extends through the insulative tiers and the conductive tiers, the metal silicide or the metal-germanium compound being everywhere laterally-spaced from said constructions. Any other attribute(s) or aspect(s) as shown and/or described herein with respect to other embodiments may be used.

Figure 29:
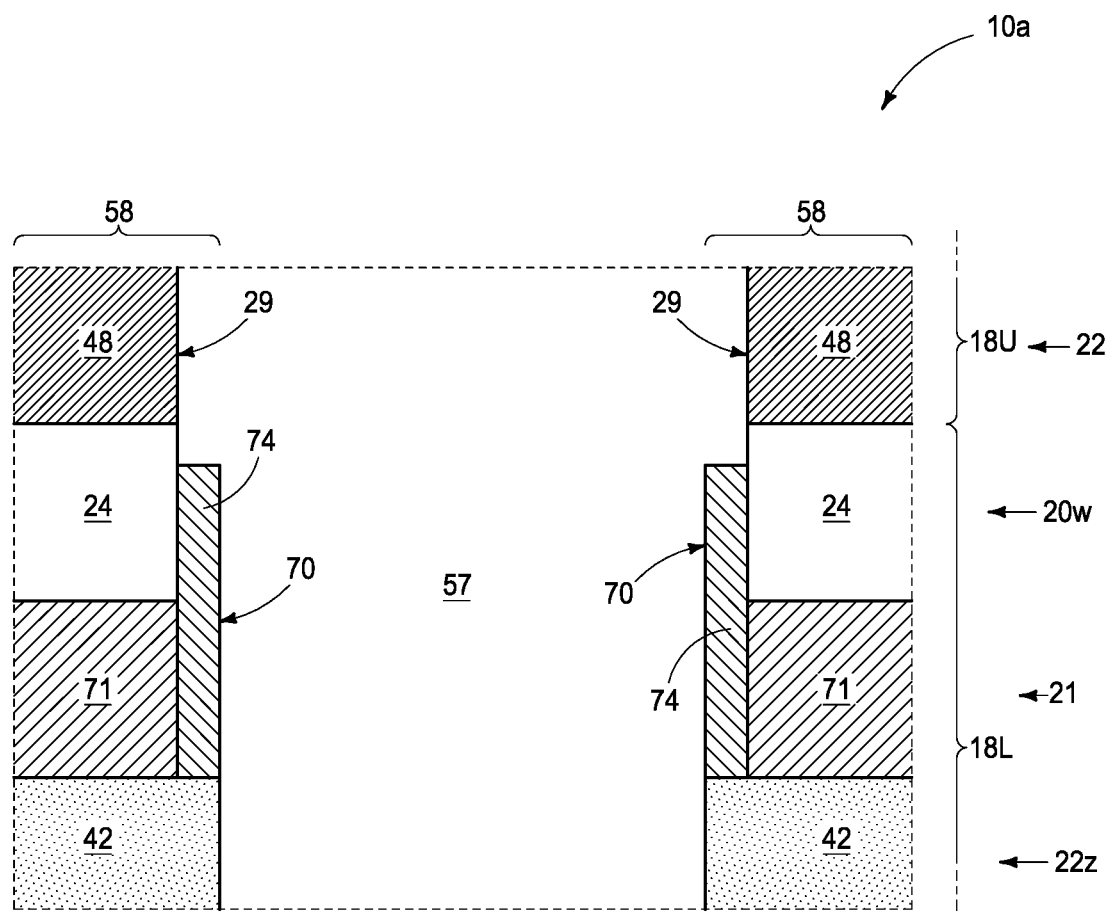

FIG. 29 shows an alternate embodiment construction 10a. Like numerals from the above-described embodiments have been used where appropriate, with some construction differences being indicated with the suffix "a" or with different numerals. FIG. 29 shows exterior lining 74 as not having been removed in the processing described above with respect to FIGS. 14 and 15. Thereby, at least one of laterally-outer sides 70 (both as shown) of individual laterally-spaced memory blocks 58 has its laterally-outer side 70 being a metal compound 74 (e.g., TiN) that extends longitudinally-along laterally-spaced memory blocks 58 in conductive tier 21. Elemental-form metal 71 that extends longitudinally-along laterally-spaced memory blocks 58 is directly against metal compound 74 laterally-inward thereof in conductive tier 21. Any other attribute(s) or aspect(s) as shown and/or described herein with respect to other embodiments may be used.

In one embodiment, a memory array (e.g., 12) comprises a conductor tier (e.g., 16) comprising conductor material (e.g., 17). The array includes laterally-spaced memory blocks (e.g., 58) individually comprising a vertical stack (e.g., 18*) comprising alternating insulative tiers (e.g., 20*) and conductive tiers (e.g., 21, 22*) directly above the conductor tier. Channel-material strings (e.g., 53) of memory cells (e.g., 56) extend through the insulative tiers and the conductive tiers. A lowest of the conductive tiers (e.g., 22z) comprises conductive material (e.g., 42, 47, 71, 73) that directly electrically couples together channel material (e.g., 36) of the channel-material strings and the conductor material of the conductor tier. An uppermost portion (e.g., that in tier 21) of the conductive material in the lowest conductive tier comprises elemental-form metal (e.g., 71) that extends longitudinally-along the laterally-spaced memory blocks proximate laterally-outer sides (e.g., 70) of the laterally-spaced memory blocks in the lowest conductive tier. The uppermost portion of the conductive material in the lowest conductive tier comprises a metal silicide (e.g., 73) or a metal-germanium compound (e.g., 73) that is directly against laterally-inner sides (e.g., 72) of the elemental-form metal and that extends longitudinally-along the laterally-spaced memory blocks in the lowest conductive tier. The metal of the metal silicide or of the metal-germanium compound is the same as that of the elemental-form metal. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. The lower portion comprises a lowest of the first tiers comprising sacrificial material, an uppermost tier, and an intermediate tier vertically between the lowest first tier and the uppermost tier. The intermediate tier comprises at least one of silicon and germanium. Lower horizontally-elongated trenches are formed through the uppermost tier and into the intermediate tier in the lower portion. The lower horizontally-elongated trenches individually are between immediately-laterally-adjacent of the memory-block regions. A metal halide is provided that reacts with the at least one of the silicon and germanium to form sidewalls of the lower horizontally-elongated trenches in the intermediate tier to comprise the metal of the metal halide and that extends longitudinally-along the laterally-spaced memory-block regions in the intermediate tier. The vertically-alternating first tiers and second tiers of an upper portion of the stack are formed above the lower portion. Channel-material strings are formed that extend through the first tiers and the second tiers in the upper portion to the lowest first tier in the lower portion. Upper horizontally-elongated trenches are formed in the upper portion that are individually directly above and extend longitudinally-along individual of the lower horizontally-elongated trenches. Through the upper and lower horizontally-elongated trenches, the sacrificial material in the lowest first tier is replaced with conductive material that directly electrically couples together channel material of the channel-material strings and the conductor material of the conductor tier.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. The lower portion comprises a lowest of the first tiers comprising sacrificial material, an uppermost tier, and an intermediate tier vertically between the lowest first tier and the uppermost tier. The intermediate tier comprises at least one of silicon and germanium. Lower horizontally-elongated trenches are formed through the uppermost tier and into the intermediate tier in the lower portion. The lower horizontally-elongated trenches are individually between immediately-laterally-adjacent of the memory-block regions. A metal halide is provided that reacts with the at least one of the silicon and germanium to form sidewalls of the lower horizontally-elongated trenches in the intermediate tier to comprise elemental-form metal that is the same metal as that of the metal halide and that extends longitudinally-along the laterally-spaced memory-block regions in the intermediate tier. After the reacting, sacrificial lines are formed comprising the elemental-form metal in the lower horizontally-elongated trenches. The vertically-alternating first tiers and second tiers of an upper portion of the stack are formed above the lower portion. Channel-material strings are formed that extend through the first tiers and the second tiers in the upper portion to the lowest first tier in the lower portion. Upper horizontally-elongated trenches are formed in the upper portion that are individually directly above, extend longitudinally-along, and extend to individual of the sacrificial lines in the lower portion. Through the upper horizontally-elongated trenches, the elemental-form metal of the sacrificial lines that is in the lower portion is removed. After the removing and through the upper and lower horizontally-elongated trenches, the sacrificial material in the lowest first tier is replaced with conductive material that directly electrically couples together channel material of the channel-material strings and the conductor material of the conductor tier.

In some embodiments, a memory array comprising laterally-spaced memory blocks individually comprises a vertical stack comprising alternating insulative tiers and conductive tiers. Channel-material strings of memory cells extend through the insulative tiers and the conductive tiers. The laterally-spaced memory blocks in a lower one of the conductive tiers comprises elemental-form metal that extends longitudinally-along the laterally-spaced memory blocks proximate laterally-outer sides of the laterally-spaced memory blocks. A metal silicide or a metal-germanium compound is directly against laterally-inner sides of the elemental-form metal in the lower conductive tier and that extends longitudinally-along the laterally-spaced memory blocks in the lower conductive tier. The metal of the metal silicide or of the metal-germanium compound is the same as that of the elemental-form metal.

In some embodiments, a memory array comprising a conductor tier comprises conductor material. Laterally-spaced memory blocks individually comprising a vertical stack comprise alternating insulative tiers and conductive tiers directly are above the conductor tier. Channel-material strings of memory cells extend through the insulative tiers and the conductive tiers. A lowest of the conductive tiers comprises conductive material that directly electrically couples together channel material of the channel-material strings and the conductor material of the conductor tier. An uppermost portion of the conductive material in the lowest conductive tier comprises elemental-form metal that extends longitudinally-along the laterally-spaced memory blocks proximate laterally-outer sides of the laterally-spaced memory blocks in the lowest conductive tier. The uppermost portion of the conductive material in the lowest conductive tier comprises a metal silicide or a metal-germanium compound that is directly against laterally-inner sides of the elemental-form metal and that extends longitudinally-along the laterally-spaced memory blocks in the lowest conductive tier. The metal of the metal silicide or of the metal-germanium compound is the same as that of the elemental-form metal.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a conductor tier comprising conductor material on a substrate;
    forming a lower portion of a stack that will comprise vertically-alternating first tiers and second tiers above the conductor tier, the stack comprising laterally-spaced memory-block regions, material of the first tiers being of different composition from material of the second tiers, the lower portion comprising:
        a lowest of the first tiers comprising sacrificial material;
        an uppermost tier; and
        an intermediate tier vertically between the lowest first tier and the uppermost tier, the intermediate tier comprising at least one of silicon and germanium;
    forming lower horizontally-elongated trenches through the uppermost tier and into the intermediate tier in the lower portion, the lower horizontally-elongated trenches individually being between immediately-laterally-adjacent of the memory-block regions;
    reacting a metal halide with the at least one of the silicon and germanium to form sidewalls of the lower horizontally-elongated trenches in the intermediate tier to comprise the metal of the metal halide and that extends longitudinally-along the laterally-spaced memory-block regions in the intermediate tier;
    forming the vertically-alternating first tiers and second tiers of an upper portion of the stack above the lower portion, forming channel-material strings that extend through the first tiers and the second tiers in the upper portion to the lowest first tier in the lower portion, and forming upper horizontally-elongated trenches in the upper portion that are individually directly above and extend longitudinally-along individual of the lower horizontally-elongated trenches; and
    through the upper and lower horizontally-elongated trenches, replacing the sacrificial material in the lowest first tier with conductive material that directly electrically couples together channel material of the channel-material strings and the conductor material of the conductor tier.

2. The method of claim 1 wherein the reacting forms the metal of the metal halide to extend longitudinally-along the immediately-laterally-adjacent memory-block regions in the intermediate tier within the immediately-laterally-adjacent memory block regions.

3. The method of claim 2 wherein the reacting forms the metal of the metal halide to extend laterally into the immediately-laterally-adjacent memory block regions to be everywhere laterally-spaced from locations of the channel-material strings.

4. The method of claim 1 wherein the intermediate tier comprises silicon in elemental form.

5. The method of claim 1 wherein the intermediate tier comprises germanium in elemental form.

6. The method of claim 1 wherein the intermediate tier comprises silicon and germanium.

7. The method of claim 6 wherein the silicon and germanium together are in alloy form.

8. The method of claim 1 wherein the metal of the sidewalls of the lower horizontally-elongated trenches in the intermediate tier is in elemental form.

9. The method of claim 8 comprising forming a metal silicide or a metal-germanium compound that is directly against laterally-inner sides of the elemental-form metal and that extends longitudinally-along the laterally-spaced memory blocks in the intermediate tier.

10. The method of claim 9 comprising forming the metal silicide.

11. The method of claim 9 comprising forming the metal-germanium compound.

12. The method of claim 9 comprising forming both of the metal silicide and the metal-germanium compound.

13. The method of claim 1 wherein the intermediate tier is of different composition from that of the uppermost tier.

14. The method of claim 1 wherein the lower portion comprises an intervening tier of different composition from that of the intermediate tier vertically between the intermediate tier and the lowest first tier.

15. The method of claim 1 wherein the lower horizontally-elongated trenches as initially formed extend through the intermediate tier, but not to the lowest first tier.

16. The method of claim 15 wherein,
    the forming lower horizontally-elongated trenches comprises etching;
    the lower portion comprises an intervening tier of different composition from that of the intermediate tier vertically between the intermediate tier and the lowest first tier; and
    the etching stopping on the intervening tier.

17. The method of claim 1 wherein the lower portion comprises a lowest of the second tiers that is below the lowest first tier.

18. The method of claim 17 comprising removing the lowest second tier before the replacing.

19. A method used in forming a memory array comprising strings of memory cells, comprising:
    forming a conductor tier comprising conductor material on a substrate;
    forming a lower portion of a stack that will comprise vertically-alternating first tiers and second tiers above the conductor tier, the stack comprising laterally-spaced memory-block regions, material of the first tiers being of different composition from material of the second tiers, the lower portion comprising:

a lowest of the first tiers comprising sacrificial material;
an uppermost tier; and
an intermediate tier vertically between the lowest first tier and the uppermost tier, the intermediate tier comprising at least one of silicon and germanium;

forming lower horizontally-elongated trenches through the uppermost tier and into the intermediate tier in the lower portion, the lower horizontally-elongated trenches individually being between immediately-laterally-adjacent of the memory-block regions;

reacting a metal halide with the at least one of the silicon and germanium to form sidewalls of the lower horizontally-elongated trenches in the intermediate tier to comprise elemental-form metal that is the same metal as that of the metal halide and that extends longitudinally-along the laterally-spaced memory-block regions in the intermediate tier;

after the reacting, forming sacrificial lines comprising the elemental-form metal in the lower horizontally-elongated trenches;

forming the vertically-alternating first tiers and second tiers of an upper portion of the stack above the lower portion;

forming channel-material strings that extend through the first tiers and the second tiers in the upper portion to the lowest first tier in the lower portion;

forming upper horizontally-elongated trenches in the upper portion that are individually directly above, extend longitudinally-along, and extend to individual of the sacrificial lines in the lower portion;

through the upper horizontally-elongated trenches, removing the elemental-form metal of the sacrificial lines that is in the lower portion; and after the removing and through the upper and lower horizontally-elongated trenches, replacing the sacrificial material in the lowest first tier with conductive material that directly electrically couples together channel material of the channel-material strings and the conductor material of the conductor tier.

20. The method of claim 19 wherein the individual sacrificial lines comprise an exterior lining as line sidewalls and as a line base, the exterior lining being of different composition from the elemental-form metal, the elemental-form metal being laterally-between and directly above the line sidewalls and the line base, respectively.

21. The method of claim 19 wherein the reacting forms the elemental-form metal of the metal halide to extend longitudinally-along the immediately-laterally-adjacent memory-block regions in the intermediate tier within the immediately-laterally-adjacent memory block regions.

22. The method of claim 21 wherein the reacting forms the elemental-form metal of the metal halide to extend laterally into the immediately-laterally-adjacent memory block regions to be everywhere laterally-spaced from locations of the channel-material strings.

* * * * *